(12) United States Patent
Nam et al.

(10) Patent No.: US 8,206,549 B2
(45) Date of Patent: Jun. 26, 2012

(54) ETCHING APPARATUS

(75) Inventors: Myeng-Woo Nam, Suwon-si (KR);
Chang-Soo Kim, Suwon-si (KR);
Jung-Hyun Kwon, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 577 days.

(21) Appl. No.: 12/153,609

(22) Filed: May 21, 2008

(65) Prior Publication Data
US 2009/0020226 A1    Jan. 22, 2009

(30) Foreign Application Priority Data
Jul. 19, 2007   (KR) .................. 10-2007-0072200

(51) Int. Cl.
*C23F 1/02* (2006.01)
(52) U.S. Cl. ................ 156/345.19; 118/301; 156/345.21
(58) Field of Classification Search ............... 156/345.2, 156/345.19, 345.21; 118/301
See application file for complete search history.

(56) References Cited

U.S. PATENT DOCUMENTS

| | | | | |
|---|---|---|---|---|
| 5,284,520 A | * | 2/1994 | Tanaka | 118/600 |
| 7,387,741 B2 | * | 6/2008 | Iyoda et al. | 216/45 |

FOREIGN PATENT DOCUMENTS

| | | |
|---|---|---|
| JP | 61066938 U | 5/1986 |
| JP | 61-104543 | 7/1986 |
| JP | 06-177093 | 6/1994 |
| JP | 08-294657 | 11/1996 |
| JP | 2001-015454 | 1/2001 |
| JP | 2004-211112 | 7/2004 |
| JP | 2005-150512 | 6/2005 |
| JP | 2005232494 A | 9/2005 |
| KR | 1020010002793 | 1/2001 |
| KR | 10-2005-0015448 | 2/2005 |

OTHER PUBLICATIONS

Machine Generated Translation of JP 2001-015454A. to Matsubara et al. Published Jan. 2001.*
Machine Generated English Translation of JP 2005-150512A. Published Jun. 9, 2005.*
Machine Generated English Translation of JP2005-232494 published Sep. 2, 2005.*
Office action from the Korean Patent Office issued in Applicant's corresponding Korean Patent Application No. 2007-0072200 dated May 28, 2008.
Korean Notice of Allowability issued on Nov. 28, 2008 in the corresponding Korean Patent Application No. 10-2007-0072200.

* cited by examiner

*Primary Examiner* — Sylvia R. MacArthur
(74) *Attorney, Agent, or Firm* — Robert E. Bushnell, Esq.

(57) ABSTRACT

An etching apparatus includes: an etching chamber; a piping unit disposed in an upper portion of the etching chamber and including a plurality of nozzles via which an etchant is sprayed; a substrate mask disposed below the piping unit; and a transfer unit disposed below the substrate mask and used to transfer a substrate. The substrate mask interposed between the piping unit including the nozzles and the substrate has a mesh structure or a plurality of holes or slits. Thus, the generation of microbubbles can be prevented during a wet etching process so that a thin layer formed on the substrate can be etched at a uniform etch rate. Also, a lift unit having a fixing unit may be disposed on a lateral surface of the substrate mask. The lift unit moves the substrate mask up and down so as to obtain a uniform etch rate.

5 Claims, 7 Drawing Sheets

ETCHING APPARATUS

CLAIM OF PRIORITY

This application makes reference to, incorporates the same herein, and claims all benefits accruing under 35 U.S.C. §119 from an application for ETCHING APPARATUS earlier filed in the Korean Intellectual Property Office on 19 Jul. 2007 and there duly assigned Serial No. 2007-0072200.

BACKGROUND OF THE INVENTION

1. Field of the Invention

The present invention relates to an etching apparatus and, more particularly, the present invention relates to a wet etching apparatus including a substrate mask.

2. Description of Related Art

In general, Flat Panel Displays (FPDs) may be classified into Liquid Crystal Displays (LCDs), Field Emission Displays (FEDs), Organic Light Emitting Diode (OLED) displays, and so forth.

The fabrication of an FPD typically includes a cleaning process, a deposition process, a photolithographic process, and an etching process. The etching process is absolutely necessary to form fine patterns according to a design specification. The etching process may be largely divided into a dry etching process and a wet etching process.

The dry etching process is an anisotropic etching process for selectively etching a thin layer formed on a substrate using a plasma. The dry etching process may be classified into a reactive dry etching process, which is performed by plasma-discharging a reactive gas under a predetermined pressure to cause a chemical reaction, and an ion dry etching process, which is performed by colliding generated ions.

The wet etching process is an isotropic etching process using an etchant. When compared with the dry etching process, the wet etching process is appropriate for mass production of large-area devices because better selectivity and etching uniformity and effective cost reduction can be obtained.

The wet etching process may be performed using a dip method or a spray method. In the dip method, a substrate having a thin layer is completely dipped in an etchant. In the spray method, an etchant is sprayed on the surface of a thin layer formed on a substrate using an additional spray unit. The dip method can obtain a uniform etch rate, while the spray method can obtain a good etching profile.

The spray method is described in detail as follows.

Initially, a substrate is loaded into an etching chamber using a transfer roller.

Thereafter, an etchant is supplied using a pump from a chemical tank to a piping unit. The chemical tank is positioned outside the etching chamber to store an etchant.

The piping unit is connected to a plurality of nozzles to spray the etchant on the substrate. Thus, the wet etching process can be performed by spraying the etchant on the substrate via the nozzles.

However, in the spray method, since the etchant is sprayed via the nozzles under a constant pressure, the etchant may collide with the underlying substrate to generate microbubbles.

As a result, a thin layer formed on the substrate cannot be etched uniformly, and a defective pattern may be obtained.

SUMMARY OF THE INVENTION

The present invention provides an etching apparatus by which a layer formed on a substrate can be etched at a uniform etch rate.

In an exemplary embodiment of the present invention, an etching apparatus includes: an etching chamber having upper and lower portions; a piping unit arranged in the upper portion of the etching chamber and including a plurality of nozzles arranged to spray an etchant; a substrate mask arranged below the piping unit; and a transfer unit, arranged below the substrate mask, to transfer a substrate.

In another exemplary embodiment of the present invention, an etching apparatus includes: an etching chamber having upper and lower portions; a piping unit arranged in the upper portion of the etching chamber and including a plurality of nozzles to spray an etchant; a substrate mask arranged below the piping unit; a lift unit arranged on a lateral surface of the substrate mask and supporting the substrate mask with a fixing unit; and a transfer unit arranged below the substrate mask to transfer a substrate.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
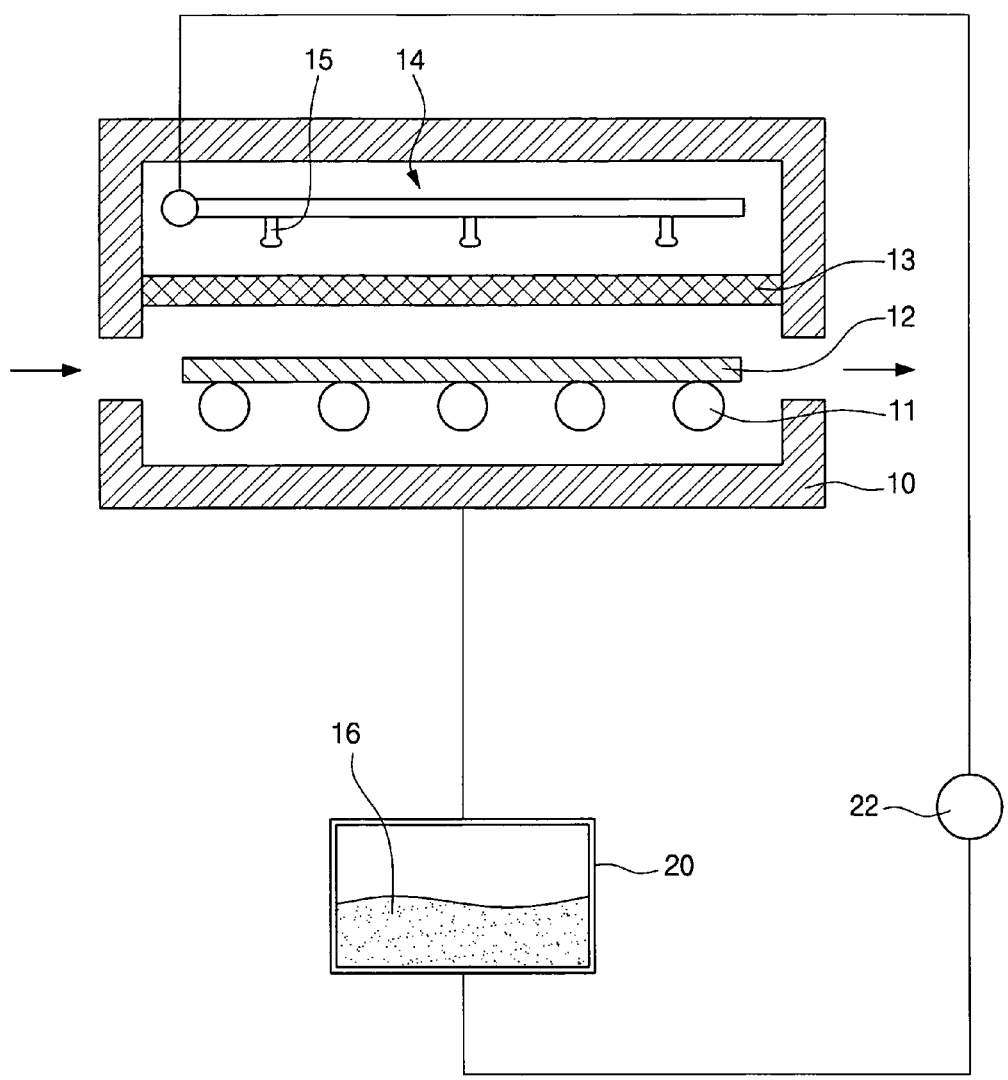
FIG. 1 is a cross-sectional view of an etching process according to an exemplary embodiment of the present invention.

The present invention is described more fully hereinafter with reference to the accompanying drawings, in which exemplary embodiments of the present invention are shown. In the drawings, the thicknesses of layers and regions may be exaggerated for clarity. The same reference numerals are used to denote the same elements throughout the specification.

Figure 2A:
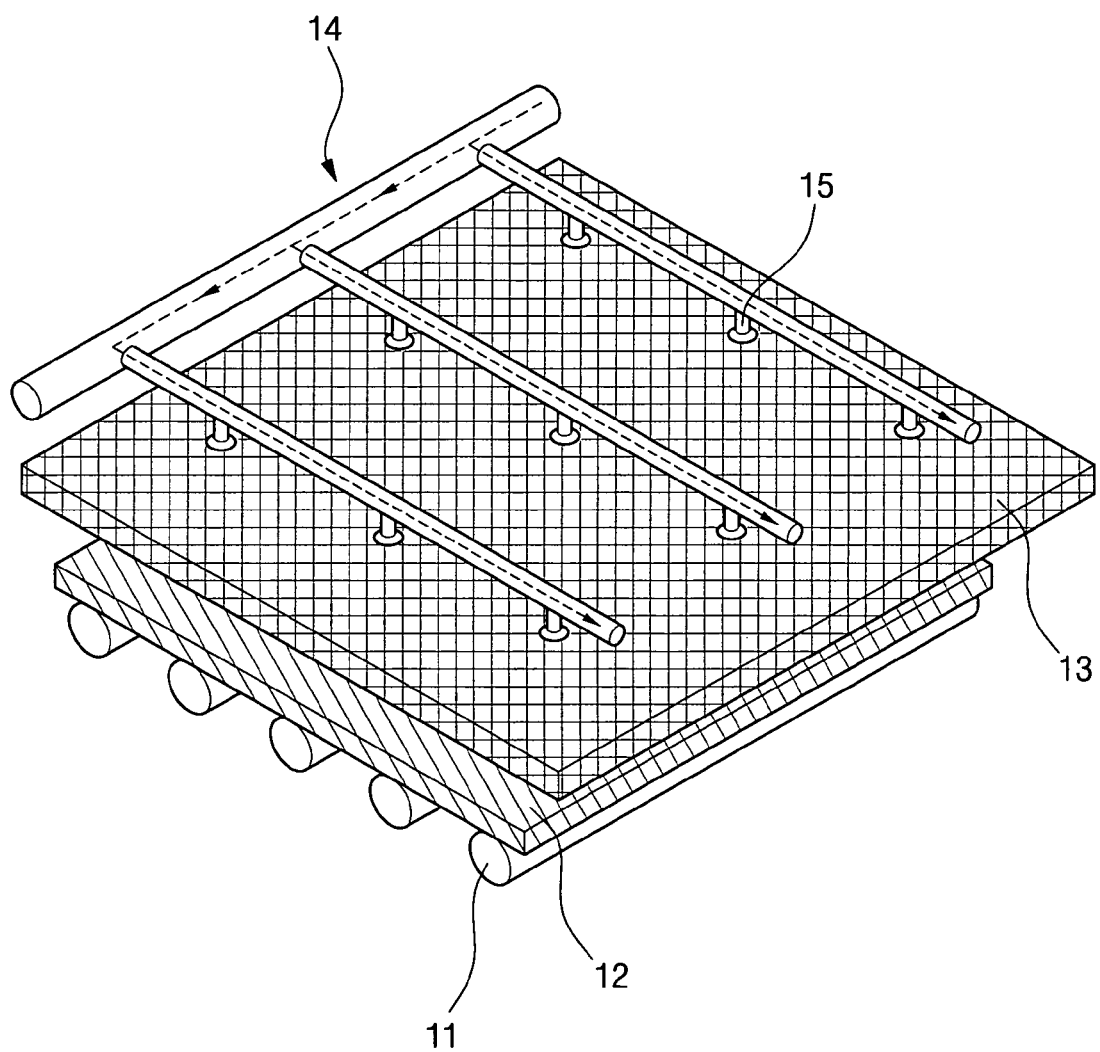
FIGS. 2A and 2B are schematic views of the etching apparatus of FIG. 1.
Figure 2B:
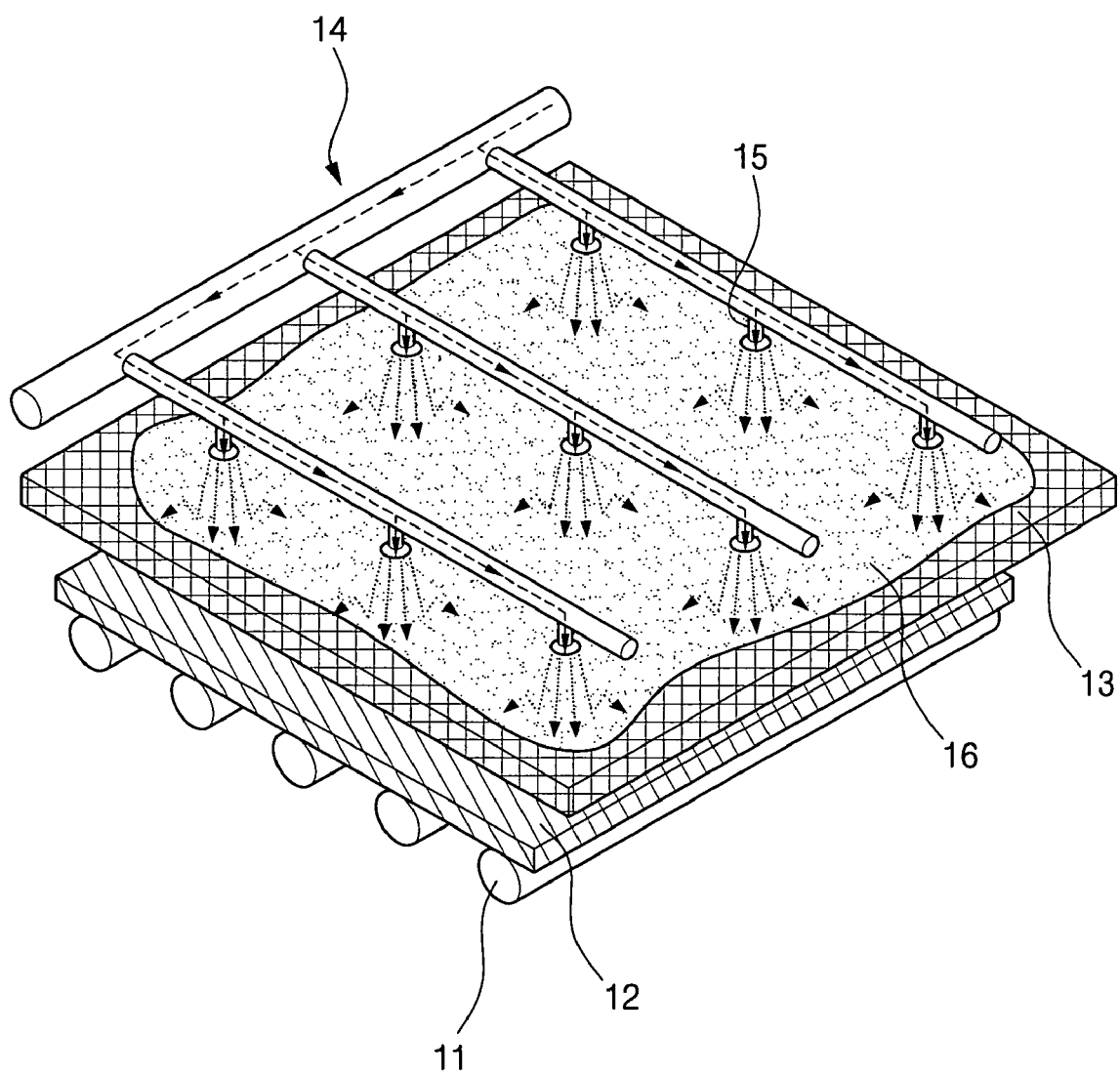
Figure 2C:
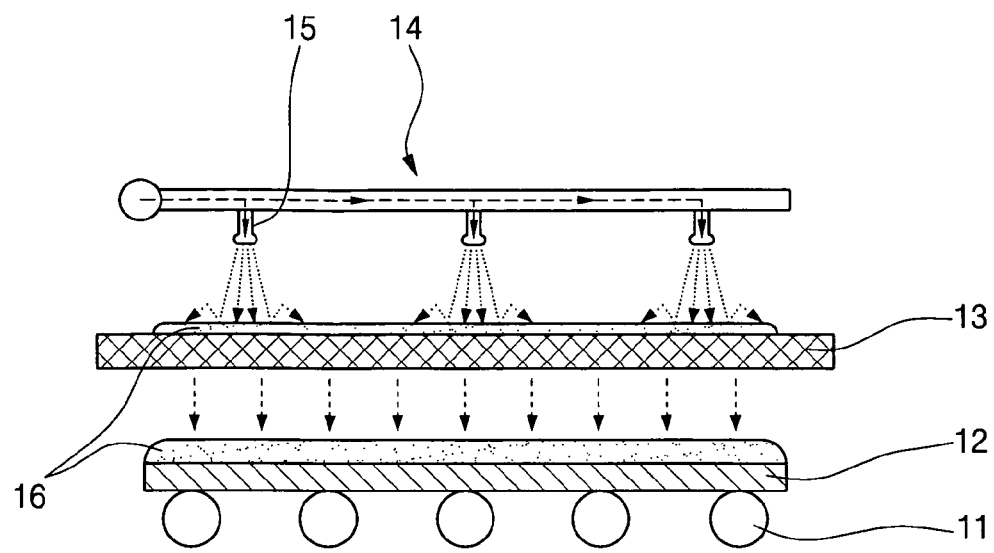
FIG. 2C is a cross-sectional view of a portion of the etching apparatus of FIG. 1.

FIG. 1 is a cross-sectional view of an etching apparatus according to an exemplary embodiment of the present invention, FIGS. 2A and 2B are schematic views of the etching apparatus of FIG. 1, and FIG. 2C is a cross-sectional view of a portion of the etching apparatus of FIG. 1.

Referring to FIG. 1, the etching apparatus according to the current exemplary embodiment of the present invention includes an etching chamber 10, a piping unit 14 disposed in an upper portion of the etching chamber 10, a substrate mask 13 disposed a predetermined distance apart from and below the piping unit 14, and a transfer unit 11 disposed a predetermined distance apart from the substrate mask 13 and used to transfer a substrate 12.

Also, a chemical tank 20 and a pump 22 are disposed outside the etching chamber 10. The chemical tank 20 is used to store an etchant 16, and the pump 22 is driven by pressure and used to supply the etchant 16 from the chemical tank 20 to the inside of the etching chamber 10.

More specifically, the piping unit 14 is located in the upper portion of the etching chamber 10 and includes a main pipe and a plurality of sub-pipes. In this case, a plurality of nozzles 15 are connected to lower portions of the sub-pipes so as to spray the etchant 16.

The substrate mask 13 is located a predetermined distance apart from and below the piping unit 14. The substrate mask 13 may be formed of an acid-resistant material that resists the etchant 16, for example, polyvinyl chloride (PVC) or polytetrafluoroethylene (PTFE). PTFE is most well known by the DuPont brand name TEFLON.

The substrate mask 13 may have a mesh structure or a plurality of openings, such as holes or slits. Thus, when the etchant 16 is directly sprayed on the substrate 12 via the nozzles 15, the generation of microbubbles can be prevented at a surface of the substrate 12 with which the etchant 16 collides.

The transfer unit 11 is located a predetermined distance apart from the substrate mask 13 below the substrate mask 13 and rotates as a roller conveyor. Thus, the transfer unit 11 allows the substrate 12 to be loaded into and unloaded from the etching chamber 10.

The chemical tank 20 is located outside the etching chamber 10 and used to store the etchant 16. The chemical tank 20 may include an additional filter (not shown) to remove foreign materials from the etchant 16.

The pump 22 is located outside the etching chamber 10 and supplies the etchant 16 stored in the chemical tank 20 to the inside of the etching chamber 10 using pressure.

The operation of the above-described etching apparatus of FIG. 1 is described in more detail below with reference to FIGS. 2A through 2C.

Referring to FIGS. 2A through 2C, initially, the substrate 12 on which a thin layer (not shown) to be etched is formed is loaded into the etching chamber 10 using the transfer unit 11.

Thereafter, the etchant 16 stored in the chemical tank 20 located outside the etching chamber 10 is supplied using the pressure-driven pump 22 to the inside of the etching chamber 10.

Thereafter, the etchant 16 is uniformly supplied via the main pipe of the piping unit 14 to the sub-pipes that are branched from the main pipe.

The etchant 16 supplied to the sub-pipes is sprayed on the substrate mask 13 under a constant pressure via the nozzles 15 located at the lower portions of the sub-pipes. The sprayed etchant 16 may spread uniformly because the substrate mask 13 has a mesh structure.

Alternatively, the sprayed etchant 16 may spread uniformly because the substrate mask 13 has a plurality of openings, such as holes or slits.

When a predetermined amount of etchant 16 spreads on the substrate mask 13, the etchant 16 falls onto the substrate 12 due to gravity. The etchant 16 falls uniformly plumb, due to the substrate mask 13, so that a thin layer of the etchant 16 is formed on the substrate 12.

Therefore, the generation of microbubbles caused by a direct collision of the sprayed etchant 16 with the substrate 12 can be prevented, unlike in a conventional spray method that does not employ the substrate mask 13. Also, the conventional spray method involves spraying an etchant at a predetermined angle to preclude uniform etching, while the etching apparatus according to the present invention enables the thin layer formed on the substrate 12 to be etched uniformly.

Thereafter, an etching process is performed using the thin layer of the etchant 16 formed on the substrate 12, and the etchant 16 is then transferred to the chemical tank 20 located outside the etching chamber 10 via a transfer pipe connected to a lower portion of the etching chamber 10.

Subsequently, the substrate 12 is unloaded from the etching chamber 10 using the transfer unit 11.

After that, foreign materials may be removed from the etchant 16 stored in the chemical tank 20 using an additional filter (not shown).

The etchant 16 is supplied again to the inside of the etching chamber 10 using the pressure-driven pump 22 located outside the etching chamber 10, and the above-described operation of the etching apparatus is repeated.

Figure 3:
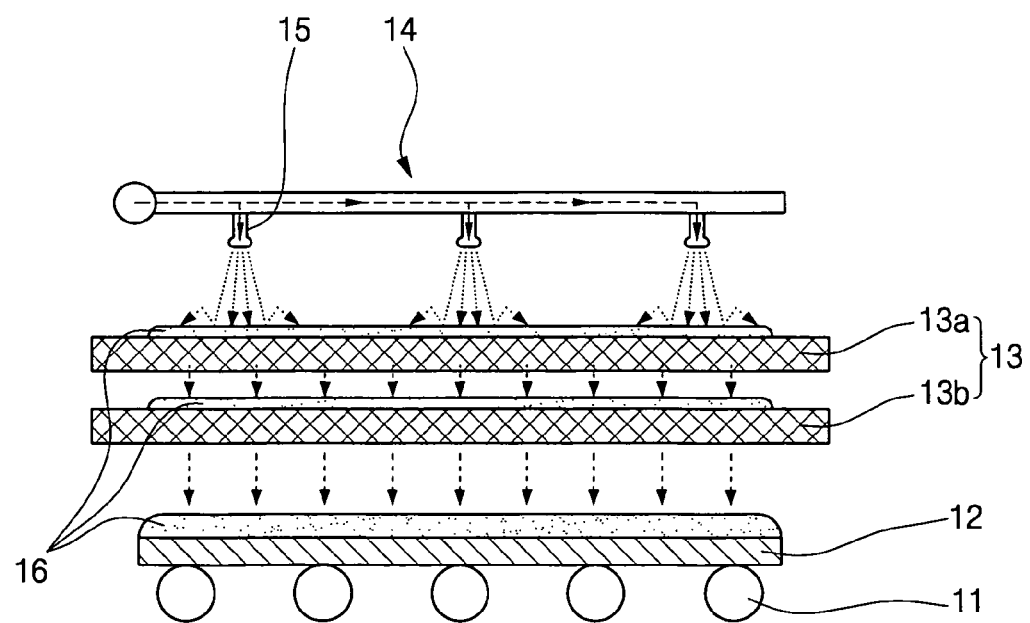
FIG. 3 is a cross-sectional view of a portion of an etching apparatus according to another exemplary embodiment of the present invention.

FIG. 3 is a cross-sectional view of a portion of an etching apparatus according to another exemplary embodiment of the present invention.

The etching apparatus of FIG. 3 has almost the same construction as the etching apparatus of FIG. 1, except for a substrate mask, and thus, a description of the same elements has been omitted here.

Referring to FIG. 3, an etchant 16 is sprayed via a plurality of nozzles 15 connected to a lower portion of a piping unit 14 on a substrate mask 13 including an upper substrate mask 13a and a lower substrate mask 13b.

The substrate mask 13 may be formed of an acid-resistant material that resists the etchant 16, for example, PVC or polytetrafluoroethylene (PTFE).

The substrate mask 13 may have a mesh structure so that the etchant 16 can spread uniformly. Alternatively, the substrate mask 13 may have a plurality of openings, such as holes or slits, so that the etchant 16 can spread uniformly.

The sprayed etchant 16 is first spread uniformly on the upper substrate mask 13a of the substrate mask 13.

Thereafter, when a predetermined amount of etchant 16 has been spread on the upper substrate mask 13a, the etchant 16 falls onto the lower substrate mask 13b due to gravity.

The etchant 16 falls uniformly plumb, due to the upper substrate mask 13a, so that the generation of microbubbles can be prevented.

Thereafter, when a predetermined amount of etchant 16 has spread on the lower substrate mask 13b, the etchant 16 falls onto a substrate 12 due to gravity.

The etchant 16 falls uniformly plumb, due to the lower substrate mask 13b, so that the generation of microbubbles can be further prevented and a thin layer of the etchant 16 is formed on the substrate 12.

The upper substrate mask 13a may be stacked over the lower substrate mask 13b to be spaced apart from the lower substrate mask 13b. A mesh or openings (e.g., holes or slits) of the upper substrate mask 13a may be arranged not to correspond to the mesh or openings (e.g., holes or slits) of the lower substrate mask 13b.

Thus, the etchant 16 can be prevented from passing through the substrate mask 13 and directly colliding with the substrate 12.

The substrate mask 13 having a plurality of sub-substrate masks that are stacked apart from one another can prevent the generation of microbubbles more effectively than a single substrate mask, and such a substrate mask 13 enables a thin layer to be etched at a uniform etch rate.

Figure 4:
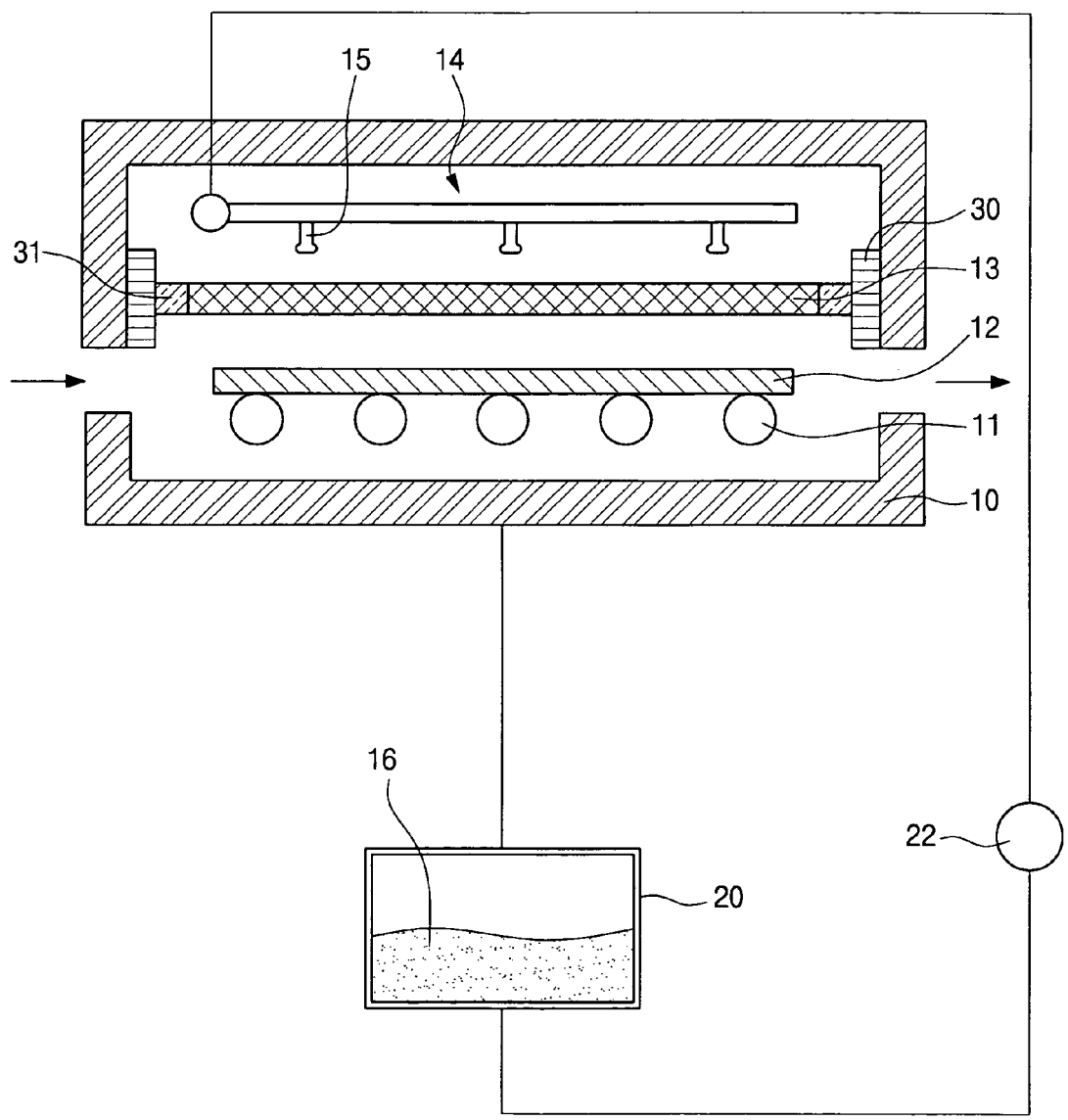
FIG. 4 is a cross-sectional view of an etching apparatus according to yet another exemplary embodiment of the present invention.
Figure 5A:
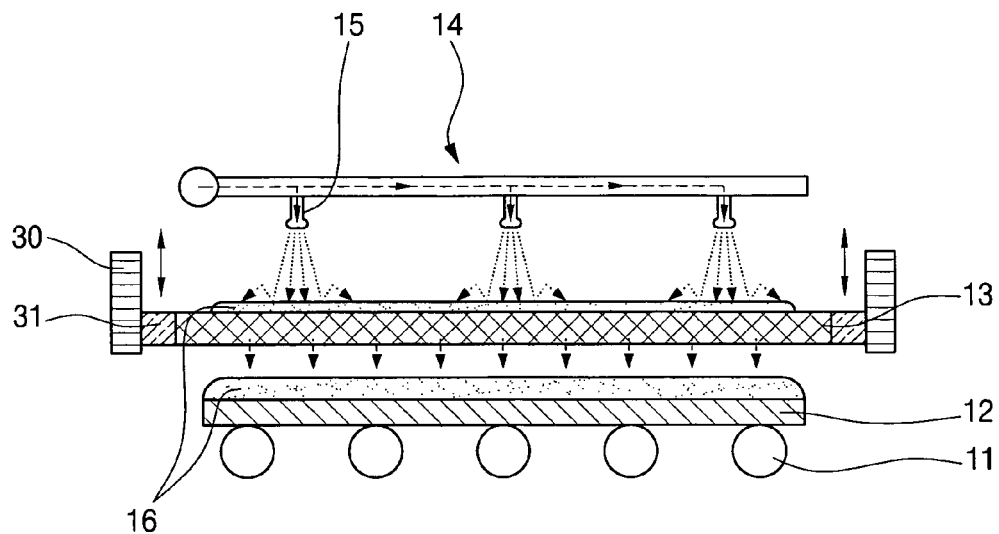
FIGS. 5A and 5B are cross-sectional views of operations of a portion of the etching apparatus of FIG. 4.
Figure 5B:
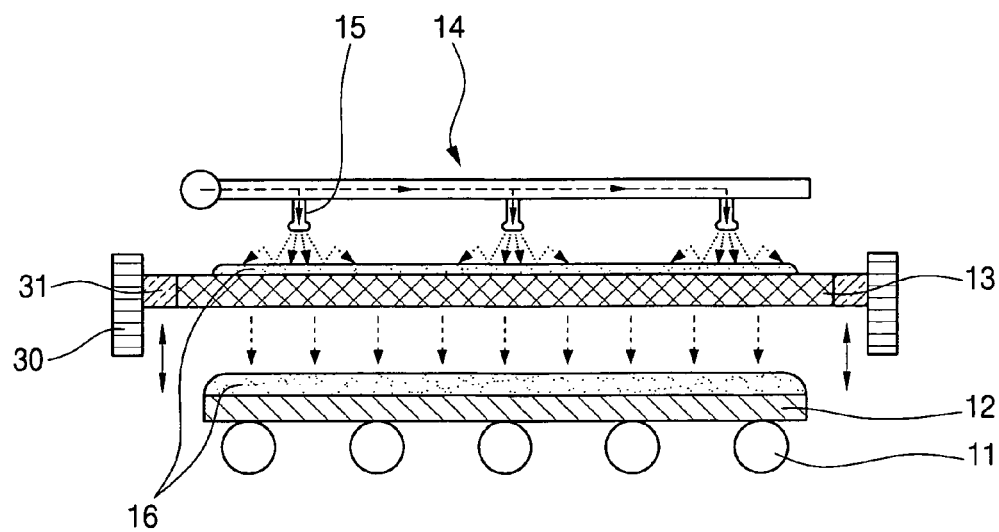

FIG. 4 is a cross-sectional view of an etching apparatus according to yet another exemplary embodiment of the present invention, and FIGS. 5A and 5B are cross-sectional views of operations of a portion of the etching apparatus of FIG. 4.

Referring to FIG. 4, the etching apparatus according to the current exemplary embodiment of the present invention includes an etching chamber 10, a piping unit 14 disposed in an upper portion of the etching chamber 10, a substrate mask 13 disposed below the piping unit 14, a lift unit 30 disposed on a lateral surface of the substrate mask 13 to support the substrate mask 13 using a fixing unit 31, and a transfer unit 11 disposed below the substrate mask 13 to transfer a substrate 12.

Also, a chemical tank 20 and a pump 22 are disposed outside the etching chamber 10. The chemical tank 20 is used to store an etchant 16, and the pump 22 is driven by pressure and used to supply the etchant 16 from the chemical tank 20 to the inside of the etching chamber 10.

More specifically, the piping unit 14 is located in the upper portion of the etching chamber 10 and includes a main pipe and a plurality of sub-pipes. A plurality of nozzles 15 are connected to lower portions of the sub-pipes so as to spray the etchant 16.

The substrate mask 13 is located below the piping unit 14. The substrate mask 13 may be formed of an acid-resistant material that resists the etchant 16, for example, PVC or polytetrafluoroethylene (PTFE).

The substrate mask 13 may have a mesh structure or a plurality of openings, such as holes or slits. Thus, when the etchant 16 is directly sprayed on the substrate 12 via the nozzles 15, the generation of microbubbles can be prevented at a surface of the substrate 12 with which the etchant 16 collides.

The lift unit 30 is located on the lateral surface of the substrate mask 13 and supports the substrate mask 13 using the fixing unit 31. The lift unit 30 is capable of moving up and down and controlling a vertical position of the substrate mask 13 between the piping unit 14 and the substrate 12 if required.

The transfer unit 11 is located below the substrate mask 13 and rotates as a roller conveyor. Thus, the transfer unit 11 allows the substrate 12 to be loaded into and unloaded from the etching chamber 10.

The chemical tank 20 is located outside the etching chamber 10 and used to store the etchant 16. The chemical tank 20 may include an additional filter (not shown) to remove foreign materials from the etchant 16.

The pump 22 is located outside the etching chamber 10 and supplies the etchant 16 stored in the chemical tank 20 to the inside of the etching chamber 10 using pressure.

The operation of the above-described etching apparatus of FIG. 4 is described in more detail below with reference to FIGS. 5A and 5B.

Referring to FIGS. 5A and 5B, the substrate 12 on which a thin layer (not shown) to be etched is formed is loaded into the etching chamber 10 using the transfer unit 11.

Thereafter, the etchant 16 stored in the chemical tank 20 located outside the etching chamber 10 is supplied using the pressure-driven pump 22 to the inside of the etching chamber 10.

Thereafter, the etchant 16 is uniformly supplied via the main pipe of the piping unit 14 to the sub-pipes that are branched from the main pipe.

The etchant 16 supplied to the sub-pipes is sprayed on the substrate mask 13 under a constant pressure via the nozzles 15 located at the lower portions of the sub-pipes.

The sprayed etchant 16 is spread uniformly because the substrate mask 13 has a mesh structure.

Alternatively, the sprayed etchant 16 is spread uniformly because the substrate mask 13 has a plurality of openings, such as holes or slits.

When a predetermined amount of etchant 16 spreads on the substrate mask 13, the etchant 16 falls onto the substrate 12 due to gravity.

The etchant 16 falls uniformly plumb, due to the substrate mask 13, so that a thin layer of the etchant 16 is formed on the substrate 12.

The substrate mask 13 is supported by the lift unit 30 that is located on the lateral surface of the substrate mask 13 and has the fixing unit 31.

When the fixing unit 31 of the lift unit 30 is shifted downward, the substrate mask 13 also shifts downward and becomes far away from the piping unit 14 and close to the substrate 12.

Thus, the etchant 16 is sprayed via the nozzles 15 at a distance, so that the etchant 16 is spread uniformly on the substrate mask 13 in a short amount of time.

On the other hand, a distance between the substrate mask 13 and the substrate 12 may be reduced. As a result, microbubbles may be caused by interference between the layer of the etchant 16 formed on the substrate 12 and the substrate mask 13 due to vibration during the transfer of the substrate 12.

Conversely, when the fixing unit 31 of the lift unit 30 is shifted upward, the substrate mask 13 also shifts upward and becomes close to the piping unit 14 and far away from the substrate 12.

Thus, the etchant 16 is sprayed via the nozzles 15 at close range. As a result, since the etchant 16 is sprayed on small regions of the substrate mask 13, it takes a relatively long time for the etchant 16 to spread uniformly on the substrate mask 13.

On the other hand, a distance between the substrate mask 13 and the substrate 12 may be increased. Thus, interference between the layer of the etchant 16 formed on the substrate 12 and the substrate mask 13, which may be caused by vibration during the transfer of the substrate 12, can be prevented.

As described above, a vertical position of the substrate mask 13 can be controlled using the lift unit 30, and a uniform etch rate can be obtained.

Thereafter, an etching process is performed using the thin layer of the etchant 16 formed on the substrate 12, and the etchant 16 is then collected in a lower portion of the etching chamber 10 and transferred to the chemical tank 20 located outside the etching chamber 10 via a transfer pipe connected to a lower portion of the etching chamber 10.

Subsequently, the substrate 12 is unloaded from the etching chamber 10 using the transfer unit 11.

After that, foreign materials may be removed from the etchant 16 stored in the chemical tank 20 using an additional filter (not shown).

The etchant 16 is supplied again to the inside of the etching chamber 10 using the pressure-driven pump 22 located outside the etching chamber 10, and the above-described operation of the etching apparatus is repeated.

Figure 6:
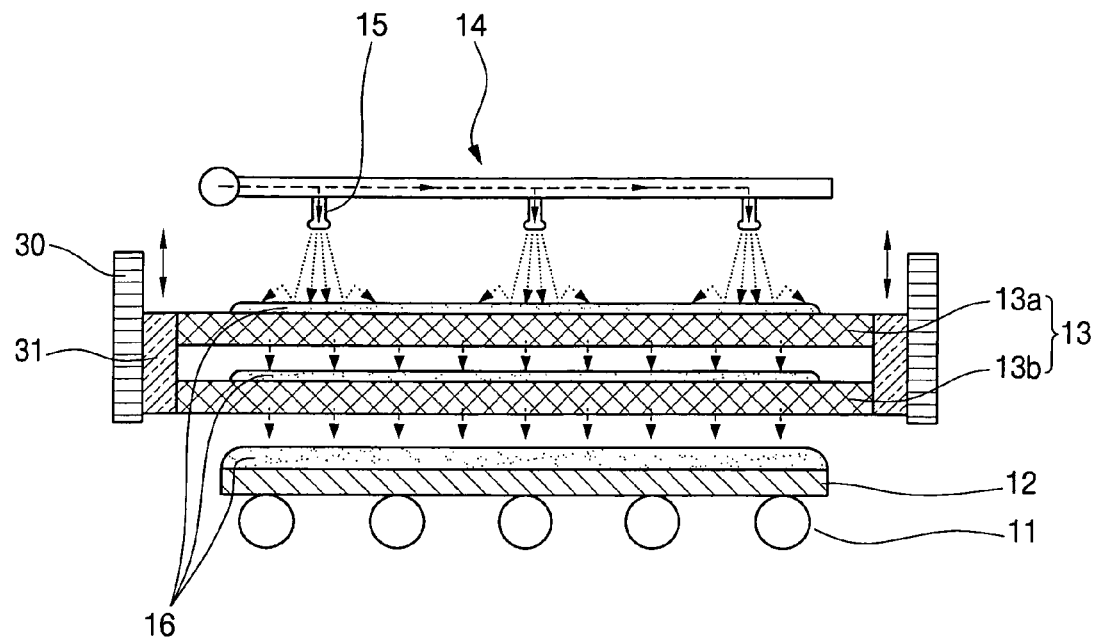
FIG. 6 is a cross-sectional view of an etching apparatus according to still another exemplary embodiment of the present invention.

FIG. 6 is a cross-sectional view of a portion of an etching apparatus according to still another exemplary embodiment of the present invention.

The etching apparatus of FIG. 6 has almost the same construction as the etching apparatus shown in FIG. 4, except for a substrate mask, and thus, a description of the same elements has been omitted here.

Referring to FIG. 6, an etchant 16 is sprayed via a plurality of nozzles 15 connected to a lower portion of a piping unit 14 on a substrate mask 13 including an upper substrate mask 13a and a lower substrate mask 13b.

The substrate mask 13 may be formed of an acid-resistant material that resists the etchant 16, for example, PVC or polytetrafluoroethylene (PTFE).

The substrate mask 13 may have a mesh structure so that the etchant 16 is spread uniformly. Alternatively, the substrate mask 13 may have a plurality of openings, such as holes or slits, so that the etchant 16 is spread uniformly.

The sprayed etchant 16 is first spread uniformly on the upper substrate mask 13a of the substrate mask 13.

Thereafter, when a predetermined amount of etchant 16 spreads on the upper substrate mask 13a, the etchant 16 falls onto the lower substrate mask 13b due to gravity. The etchant 16 falls uniformly plumb, due to the upper substrate mask 13a, so that the generation of microbubbles can be prevented.

Thereafter, when a predetermined amount of etchant 16 spreads on the lower substrate mask 13b, the etchant 16 falls onto a substrate 12 due to gravity. The etchant 16 falls uniformly plumb, due to the lower substrate mask 13b, so that the generation of microbubbles can be further prevented and a thin layer of the etchant 16 is formed on the substrate 12.

The upper substrate mask 13a may be stacked over the lower substrate mask 13b to be spaced apart from the lower substrate mask 13b. A mesh or openings (e.g., holes or slits) of the upper substrate mask 13a may be arranged not to correspond to the mesh or the openings (e.g., holes or slits) of the lower substrate mask 13b.

Thus, the etchant 16 can be prevented from passing through the substrate mask 13 and directly colliding with the substrate 12.

Accordingly, the substrate mask 13 having a plurality of sub-substrate masks that are stacked apart from one another can prevent the generation of microbubbles more effectively than a single substrate mask, and thereby the substrate mask 13 having a plurality of sub-substrate masks enables a thin layer formed on the substrate 12 to be etched at a uniform etch rate.

The substrate mask 13 is supported by a lift unit 30 that is located on a lateral surface of the substrate mask 13 and has a fixing unit 31.

When the fixing unit 31 of the lift unit 30 is shifted downward, the substrate mask 13 also shifts downward and becomes far away from the piping unit 14 and close to the substrate 12.

Thus, the etchant 16 is sprayed via the nozzles 15 at a distance, so that the etchant 16 can spread uniformly on the substrate mask 13 in a short amount of time.

On the other hand, a distance between the substrate mask 13 and the substrate 12 may be reduced. As a result, microbubbles may be caused by interference between the layer of the etchant 16 formed on the substrate 12 and the substrate mask 13 due to vibration during the transfer of the substrate 12.

Conversely, when the fixing unit 31 of the lift unit 30 is shifted upward, the substrate mask 13 also shifts upward and becomes close to the piping unit 14 and far away from the substrate 12.

Thus, the etchant 16 is sprayed via the nozzles 15 at close range. As a result, since the etchant 16 is sprayed on small regions of the substrate mask 13, it takes a relatively long time for the etchant 16 to spread uniformly on the substrate mask 13.

On the other hand, a distance between the substrate mask 13 and the substrate 12 may be increased. Thus, interference between the layer of the etchant 16 formed on the substrate 12 and the substrate mask 13, which may be caused by vibration during the transfer of the substrate 12, can be prevented.

As described above, by controlling a vertical position of the substrate mask 13 using the lift unit 30, a uniform etch rate can be obtained.

Although the operation of the etching apparatus according to the exemplary embodiments of the present invention has been described above based mainly on a spray method, the present invention is not limited thereto. That is, the etching apparatus according to the exemplary embodiments of the present invention can be applied to a combination of a spray method and a dip method, both of which are wet etching methods.

Also, the above-described etching apparatus may be applied to any thin layer etching process required for fabricating Flat Panel Displays (FPDs). A method of fabricating an Organic Light Emitting Diode (OLED) display device including a thin film transistor (TFT) using the etching apparatus according to the present invention is described below.

Figure 7:
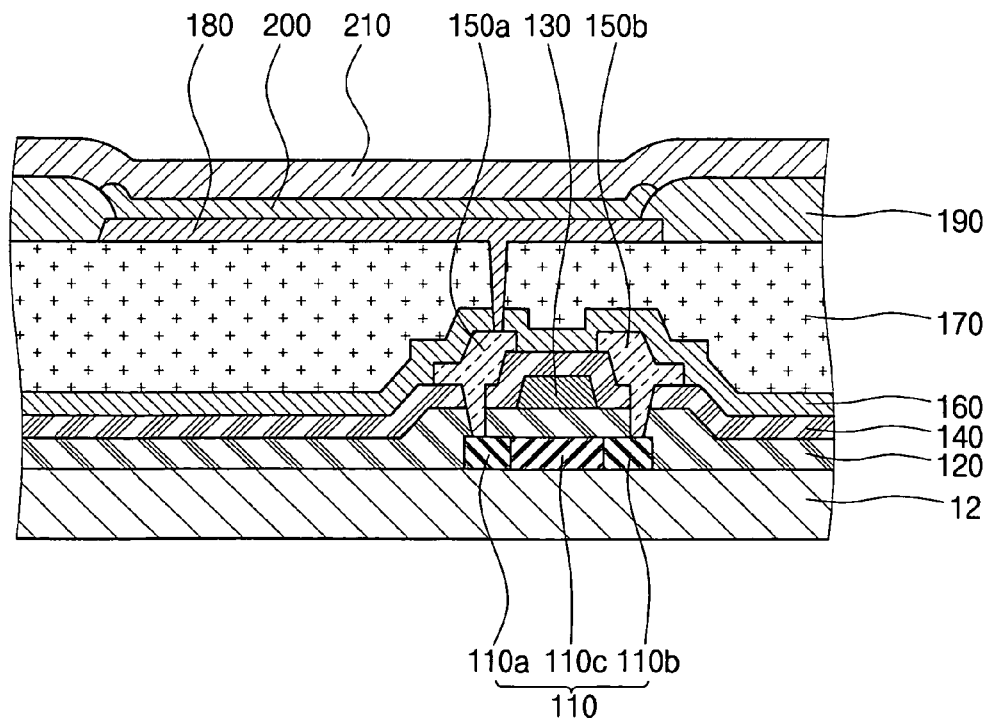
FIG. 7 is a cross-sectional view of a portion of an Organic Light Emitting Diode (OLED) display.

FIG. 7 is a cross-sectional view of a portion of an OLED display.

Referring to FIG. 7, a substrate 12 is prepared. The substrate may be a glass substrate or a plastic substrate.

Thereafter, a buffer layer (not shown) may be disposed on the substrate 12. The buffer layer may prevent the diffusion of moisture or impurities from the substrate 12 or control the transmission rate of heat during the crystallization of a semiconductor layer 110, which will be formed later, to facilitate the crystallization of amorphous silicon (a-Si).

Thereafter, an a-Si layer is formed on the buffer layer. The a-Si layer may be deposited by a Physical Vapor Deposition (PVD) technique using, for example, a sputtering apparatus, or by a Chemical Vapor Deposition (CVD) technique using, for example, a Plasma-Enhanced CVD (PECVD) apparatus or a Low-Pressure CVD (LPCVD) apparatus.

Also, the a-Si layer may be dehydrogenated during or after the formation of the a-Si layer to reduce the concentration of hydrogen.

Thereafter, the a-Si layer may be crystallized into a polycrystalline silicon (poly-Si) layer. The crystallization of the a-Si layer may be performed using an Excimer Laser Annealing (ELA) technique, a Sequential Lateral Solidification (SLS) technique, a Metal Induced Crystallization (MIC) technique, a Metal Induced Lateral Crystallization (MILC) technique, or a Super-Grained Silicon (SGS) technique.

Subsequently, a patterning process including an etching process is performed on the poly-Si layer to form a semiconductor layer 110 with a predetermined pattern.

A gate insulating layer 120 is formed on the entire surface of the substrate 12 having the semiconductor layer 110. The gate insulating layer 120 can protect underlying elements and electrically insulate the underlying elements from elements that will be formed thereon.

A gate metal layer is deposited on the gate insulating layer 120. The gate metal layer may be formed of aluminum (Al), an Al alloy, molybdenum (Mo), or a Mo alloy.

A patterning process including an etching process is performed on the gate metal layer to form a gate electrode 130 corresponding to a predetermined region of the semiconductor layer 110.

Thereafter, N-type or P-type impurities are implanted using the gate electrode 130 as a mask, so that source and drain regions 110a and 110b and a channel region 110c are formed in the semiconductor layer 110. The semiconductor layer 110 is divided into the source and drain regions 110a and 110b and the channel region 110c, because regions into which impurities are doped during the above-described impurity implantation process are defined as the source and drain regions 110a and 110b, and a region into which impurities are not doped due to the gate electrode 130 is defined as the channel region 110c where a channel will be formed during the drive of the TFT.

Thereafter, an interlayer insulating layer 140 is formed on the entire surface of the substrate 12. The interlayer insulating layer 140 can protect the underlying elements and electrically insulate the underlying elements from elements that will be formed thereon.

The buffer layer, the gate insulating layer 120, and the interlayer insulating layer 140 may be formed of $SiO_2$, $SiN_x$, or multiple layers thereof.

Thereafter, contact holes are formed through the interlayer insulating layer 140 and the gate insulating layer 120 to partially expose the source and drain regions 110a and 110b of the semiconductor layer 110.

A patterning process including an etching process is performed on the interlayer insulating layer 140 to form source and drain electrodes 150a and 150b with predetermined patterns. The source and drain electrodes 150a and 150b are connected to the source and drain regions 110a and 110b of the semiconductor layer 110 through the contact holes.

The source and drain electrodes 150a and 150b may be formed of Al, an Al alloy, Mo, or a Mo alloy.

Thereafter, a protective layer 160 is formed on the entire surface of the substrate 12. The protective layer 160 may be formed of $SiO_2$, $SiN_x$, or multiple layers thereof.

A planarization layer 170 may be formed on the protective layer 160. The planarization layer 170 may be formed of an organic material selected from the group consisting of acryl, benzocyclobutene (BCB), and polyimide in order to flatten a bump generated by the underlying TFT.

Subsequently, predetermined regions of the protective layer 160 and the planarization layer 170 are etched, thereby forming via holes to expose the source and drain electrodes 150a and 150b.

A pixel electrode 180 is formed on the planarization layer 170. The pixel electrode 180 is connected to either the source or drain electrodes 150a and 150b that are exposed through the via holes.

The pixel electrode 180 may be formed of Indium Tin Oxide (ITO) or Indium Zinc Oxide (IZO) to be a transparent electrode, so that the OLED display can be a bottom-emitting OLED display. Alternatively, a reflective layer (not shown) that reflects light may be arranged under the pixel electrode 180 so that the OLED display can be a top-emitting OLED display.

The reflective layer may be formed of one material selected from the group consisting of Pt, Au, Ir, Cr, Mg, Ag, Al, and an alloy thereof, and stacked under the pixel electrode 180. Thereafter, a pixel defining layer 190 is formed on the entire surface of the substrate 12. The pixel defining layer 190 has an opening to expose a predetermined region of the pixel electrode 180. The pixel defining layer 190 may be formed of one material selected from the group consisting of BCB, an acryl polymer, and polyimide.

Thereafter, an organic layer 200 including an organic emission layer (not shown) is formed on the exposed region of the pixel electrode 180, and an opposing electrode 210 is formed on the entire top surface of the substrate 12, thereby completing the OLED display.

As described above, an etching apparatus according to the present invention can prevent the generation of microbubbles during a wet etching process so as to obtain a uniform etch rate.

Although the present invention has been described with reference to certain exemplary embodiments thereof, it will be understood by those skilled in the art that a variety of modifications may be made to the described embodiments without departing from the spirit and scope of the present invention as defined by the appended claims.

What is claimed is:

1. An etching apparatus comprising:
   an etching chamber having upper and lower portions;
   a piping unit arranged in the upper portion of the etching chamber and including a plurality of nozzles to spray an etchant;
   a substrate mask arranged below the piping unit;
   a lift unit arranged on a lateral surface of the substrate mask and supporting the substrate mask with a fixing unit; and
   a transfer unit arranged below the substrate mask to transfer a substrate; wherein
   the substrate mask comprises a plurality of either holes or slits and is formed of either polyvinyl chloride (PVC) or polytetrafluoroethylene (PTFE).

2. The etching apparatus according to claim 1, wherein the substrate mask comprises mesh structure.

3. The etching apparatus according to claim 1, wherein the substrate mask comprises a plurality of sub-substrate masks stacked apart from one another.

4. The etching apparatus according to claim 1, wherein the lift unit moves the substrate mask up and down.

5. An etching apparatus comprising:
   an etching chamber having upper and lower portions;
   a piping unit arranged in the upper portion of the etching chamber and including a plurality of nozzles to spray an etchant;
   a substrate mask arranged below the piping unit;
   a lift unit arranged on a lateral surface of the substrate mask and disposed on inside of the etching chamber;
   a fixing unit disposed between the lift unit and the lateral surface of the substrate mask supporting the substrate mask; and
   a transfer unit arranged below the substrate mask to transfer a substrate.

* * * * *